(12) United States Patent
Fung et al.

(10) Patent No.: US 6,806,584 B2
(45) Date of Patent: Oct. 19, 2004

(54) SEMICONDUCTOR DEVICE STRUCTURE INCLUDING MULTIPLE FETS HAVING DIFFERENT SPACER WIDTHS

(75) Inventors: Ka Hing Fung, Fishkill, NY (US); Percy V. Gilbert, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/277,907

(22) Filed: Oct. 21, 2002

(65) Prior Publication Data

US 2004/0075151 A1 Apr. 22, 2004

(51) Int. Cl.⁷ .......................................... H01L 27/088
(52) U.S. Cl. ..................... 257/900; 257/368; 257/369
(58) Field of Search ................. 257/900, 368, 257/369

(56) References Cited

U.S. PATENT DOCUMENTS

| | | | | |
|---|---|---|---|---|
| 4,577,391 A | * | 3/1986 | Hsia et al. .................... | 29/571 |
| 4,648,937 A | | 3/1987 | Ogura et al. | |
| 4,729,006 A | | 3/1988 | Dally et al. | |
| 5,254,866 A | * | 10/1993 | Ogoh ......................... | 257/369 |
| 5,291,052 A | * | 3/1994 | Kim et al. ................... | 257/369 |
| 5,296,401 A | * | 3/1994 | Mitsui et al. ................. | 437/57 |
| 5,547,894 A | | 8/1996 | Mandelman et al. | |
| 5,763,312 A | | 6/1998 | Jeng et al. ................... | 438/303 |
| 5,828,103 A | | 10/1998 | Hsu ........................... | 257/344 |
| 5,899,722 A | | 5/1999 | Huang ......................... | 438/305 |
| 5,905,293 A | | 5/1999 | Jeng et al. ................... | 257/408 |
| 5,994,743 A | * | 11/1999 | Masuoka .................... | 257/369 |
| 6,028,339 A | * | 2/2000 | Frenette et al. ............. | 257/364 |
| 6,064,096 A | * | 5/2000 | Son ........................... | 257/368 |
| 6,222,238 B1 | * | 4/2001 | Chang et al. ............... | 257/369 |
| 6,239,467 B1 | * | 5/2001 | Gardner et al. ............. | 257/900 |
| 6,245,621 B1 | | 6/2001 | Hirohama ................... | 438/303 |
| 6,248,623 B1 | | 6/2001 | Chien et al. ................ | 438/241 |
| 6,448,618 B1 | * | 9/2002 | Inaba et al. ................. | 257/900 |
| 6,512,273 B1 | * | 1/2003 | Krivokapic et al. ........ | 257/369 |
| 6,548,877 B2 | * | 4/2003 | Yang et al. ................. | 257/382 |

FOREIGN PATENT DOCUMENTS

JP                3-180058        *    8/1991      ................ 257/900

* cited by examiner

*Primary Examiner*—Mark V. Prenty
(74) *Attorney, Agent, or Firm*—Joseph P. Abate

(57) ABSTRACT

A semiconductor device structure includes at least two field effect transistors formed on same substrate, the first field effect transistor includes a spacer having a first width, the second field effect transistor includes a spacer having a second width, the first width being different than said second width. Preferably, the first width is narrower than the second width.

8 Claims, 8 Drawing Sheets

SEMICONDUCTOR DEVICE STRUCTURE INCLUDING MULTIPLE FETS HAVING DIFFERENT SPACER WIDTHS

FIELD OF THE INVENTION

The present invention relates to semiconductor device structures and, more particularly, to FET device structures formed on the same substrate, and to methods for fabrication.

BACKGROUND OF THE INVENTION

In CMOS technologies, NFET and PFET devices are optimized to achieve required CMOS performance. Very different dopant species are used for NFET and PFET devices, accordingly. These species have very different physical properties such as diffusion rate and maximum activated concentration. In conventional CMOS technologies, both NFET and PFET usually share the same spacer process and topology. In order to optimize CMOS performance, the spacers typically are of one maximum width and are designed to trade-off the performance between NFET and PFET. For example, if Arsenic and Boron are used as the source/drain dopants for NFET and PFET, respectively, it is known that a narrower spacer is better for NFET but a much wider one is better for PFET, because Arsenic diffuses much slower than Boron. In this case, the PFET is a limiting factor. Thus, the maximum width of all spacers is optimized for PFET, trading-off the NFET performance. See, for example: U.S. Pat. No. 5,547,894 (Mandelman et al., issued Aug. 20, 1996, entitled "CMOS Processing with Low High-Current FETS"); U.S. Pat. No. 4,729,006 (Dally et al., issued Mar. 1, 1988, entitled "Sidewall Spacers for CMOS Circuit Stress Relief/Isolation and Method for Making"); and U.S. Pat. No. 4,648,937 (Ogura et al., issued Mar. 10, 1987, entitled "Method of Preventing Asymmetric Etching of Lines in Sub-Micrometer Range Sidewall Images Transfer"); which are all incorporated by reference herein in their entireties.

It is a problem, therefore, to optimize spacer width and FET performance for both the NFET and the PFET on the same substrate.

OBJECTS OF THE INVENTION

The present invention solves this problem by using a dual-spacer width to permit optimizing NFET or PFET device performance independently on the same substrate.

It is a principal object of the present invention to optimize performances of two different MOS devices having a common semiconductor substrate.

It is an additional object of the present invention to optimize independently the performances of an NFET device and a PFET device formed on one substrate.

It is a further object of the present invention to increase the drive current performance of an NFET device while decreasing the short channel effect in a PFET.

SUMMARY OF THE INVENTION

According to the present invention, a semiconductor device structure includes at least two field effect transistors formed on a same substrate, the first field effect transistor including a spacer having a first width, the second field effect transistor including a spacer having a second width, the first width being different than the second width.

The present invention also includes a method (process) for fabricating the semiconductor device structure.

BRIEF DESCRIPTION OF THE DRAWINGS

These and other objects, advantages and aspects of the invention will be better understood by the following detailed description of a preferred embodiment when taken in conjunction with the accompanying drawings.

DETAILED DESCRIPTION OF THE INVENTION

Figure 1:
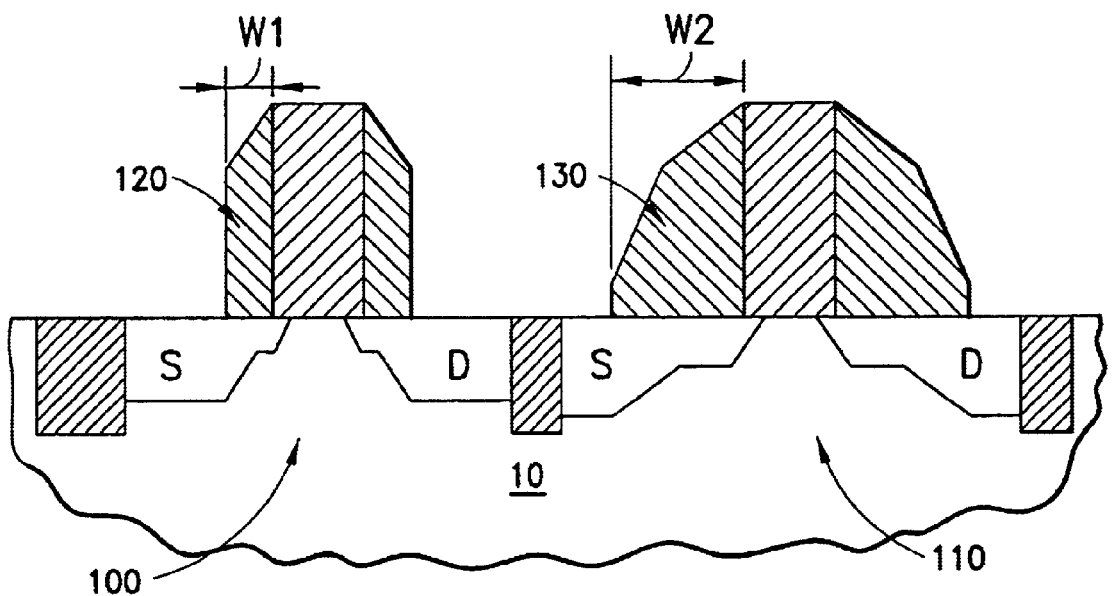
FIG. 1 is a side schematic view of two MOSFETs with different spacer widths adjacent to each other on the same substrate according to the present invention.
Figure 2:
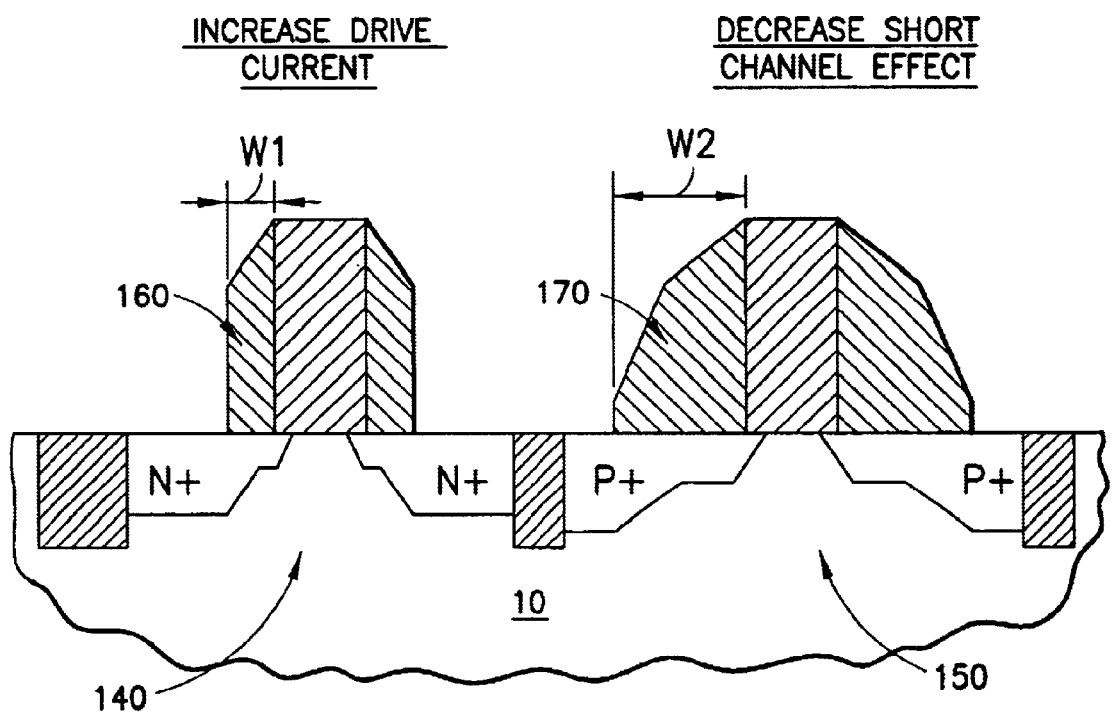
FIG. 2 is a side schematic view of n-type MOSFET with a narrower spacer and p-type MOSFET with a wider spacer adjacent to each other on the same substrate according to the present invention.
Figure 3A:
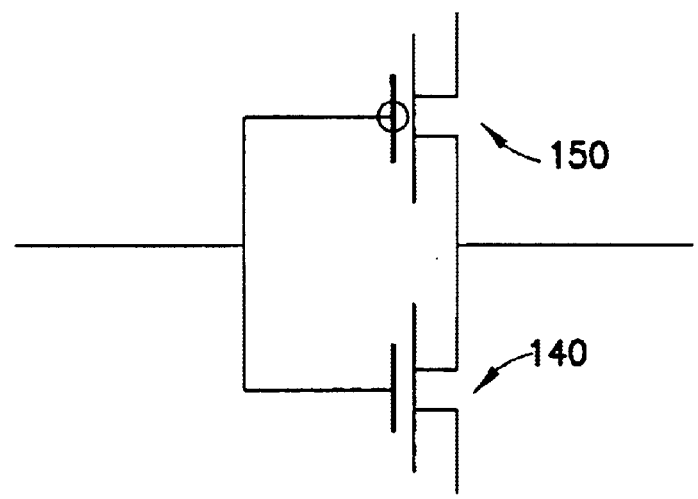
FIG. 3(a) is an inverter circuit schematic.
Figure 3B:
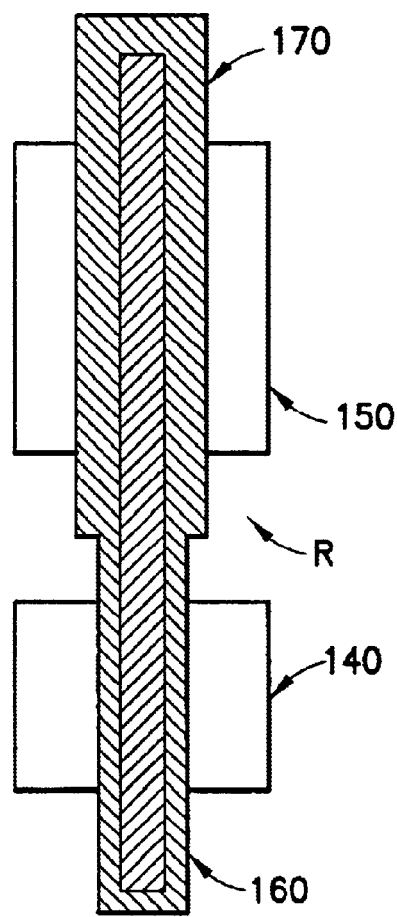
FIG. 3(b) is a top plan view of an on-wafer layout of the inverter circuit having the dual width spacers according to the present invention.
Figure 4:
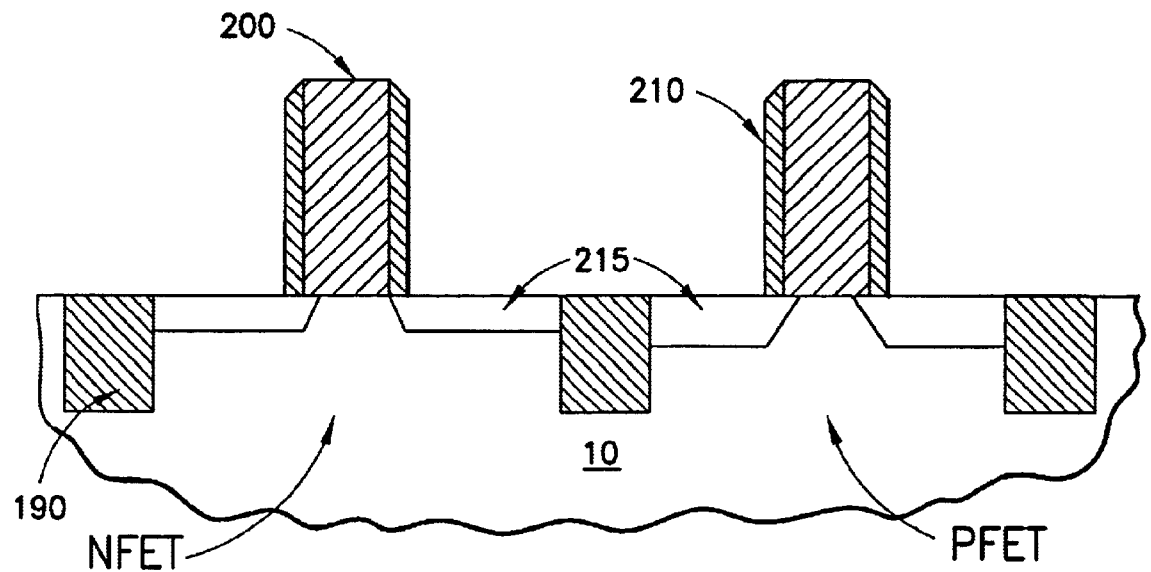
FIG. 4 is a side schematic view of a partially processed MOSFET device structure with gate stacks, extension spacers, extension implants and isolation.
Figure 5:
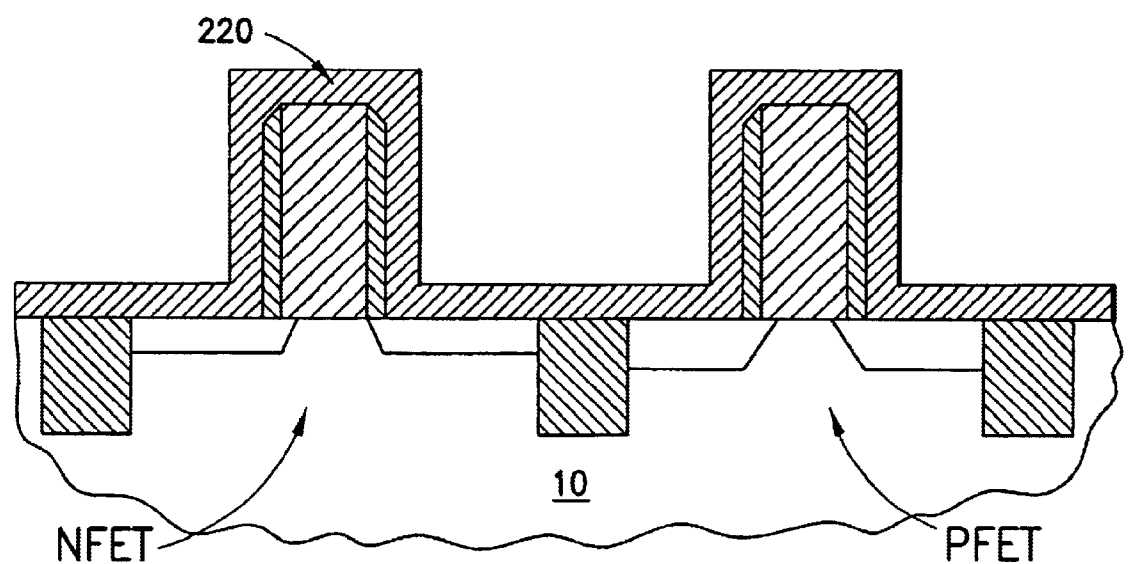
FIG. 5 shows the structure of FIG. 4, after a thin film dielectric 220 is deposited.
Figure 6:
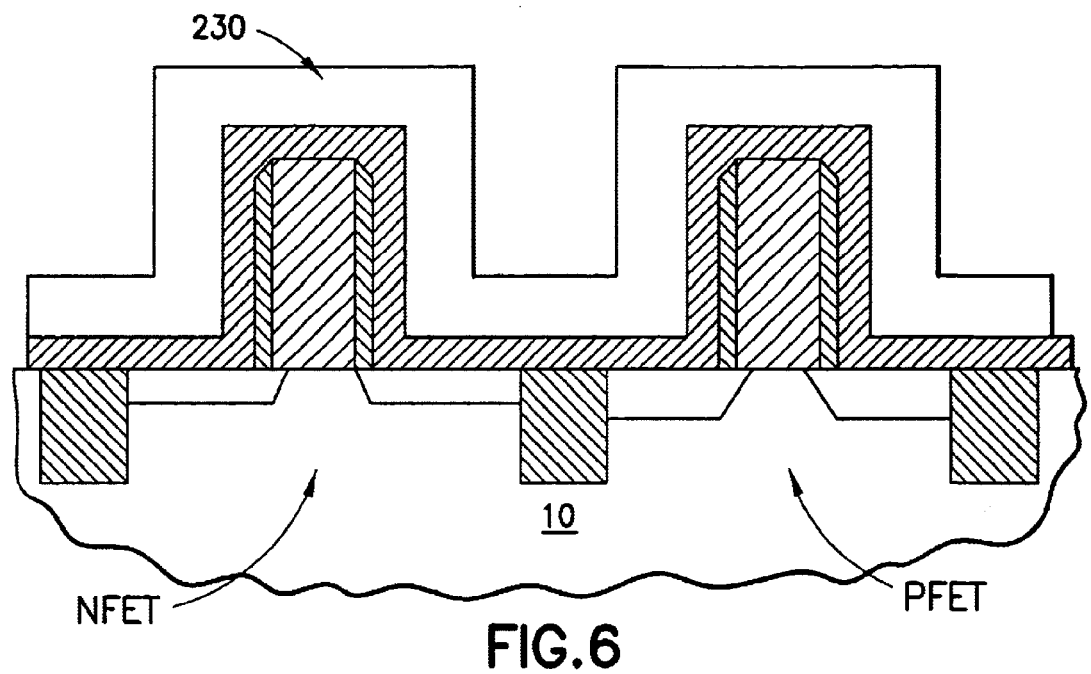
FIG. 6 shows the structure of FIG. 5, after another thin film dielectric 230 is deposited.

The present invention is described with the final structures (FIGS. 1, 2, 14, 15) first, and then with the process sequence. FIG. 1 shows two MOSFETs 100, 110 formed on the same semiconductor substrate 10 having two different spacers 120, 130. Spacer 120 has a smaller width (W1) than the width (W2) of spacer 130. The substrate is a bulk wafer, SOI wafer, GaAs or any type of semiconductor substrate. The number of different spacer widths can be more than two, if necessary to meet the needs of different transistors. According to a preferred embodiment of this invention, there are different spacer widths for NFET 140 and PFET 150 as shown in FIG. 2. The PFET 150 has a wider spacer 170 than the NFET 140. The spacers 120, 130, 160, 170 are schematically shown as single spacers for discussion, but are understood alternatively to include multiple layers (composite spacers). The narrower spacer 160 allows the optimization of the source/drain implant N+ in NFET in order to minimize known source/drain resistance. FIG. 3(a) and FIG. 3(b) show an example of a circuit and layout using this invention. FIG. 3(a) shows the circuit schematic of inverter, while FIG. 3(b) shows a corresponding on-wafer layout. In the figures, the PFET 150 is shown on the top of NFET 140. The spacer width changes from wide in the PFET region to narrow in the NFET region. The transition region R is located approximately (±10%) in a middle region between the two devices 140, 150.

Figure 7:
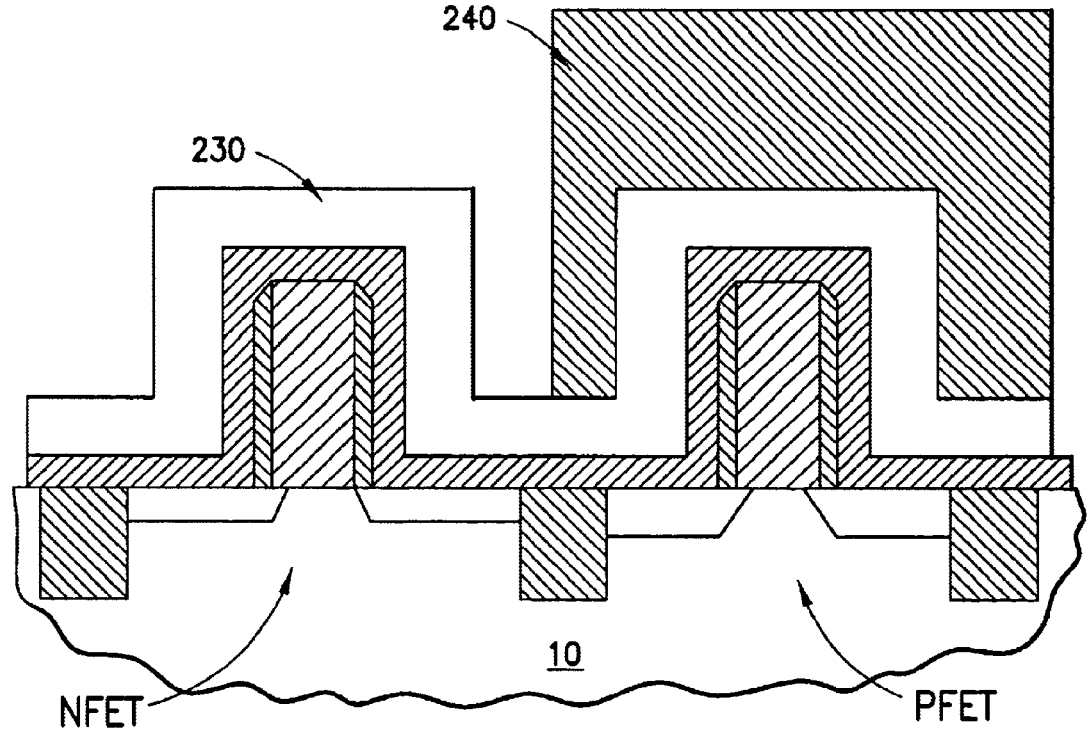
FIG. 7 shows the structure of FIG. 6, after a photoresist 240 is patterned.
Figure 8:
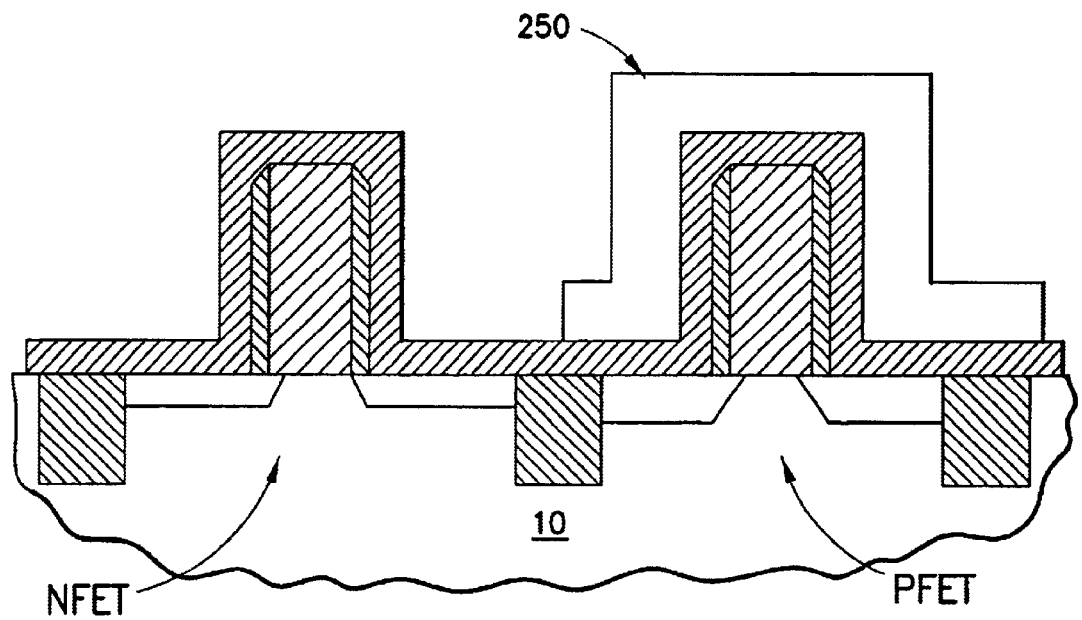
FIG. 8 shows the structure of FIG. 7, after an exposed part of the dielectric 230 is removed, and the photoresist 240 is removed.
Figure 9:
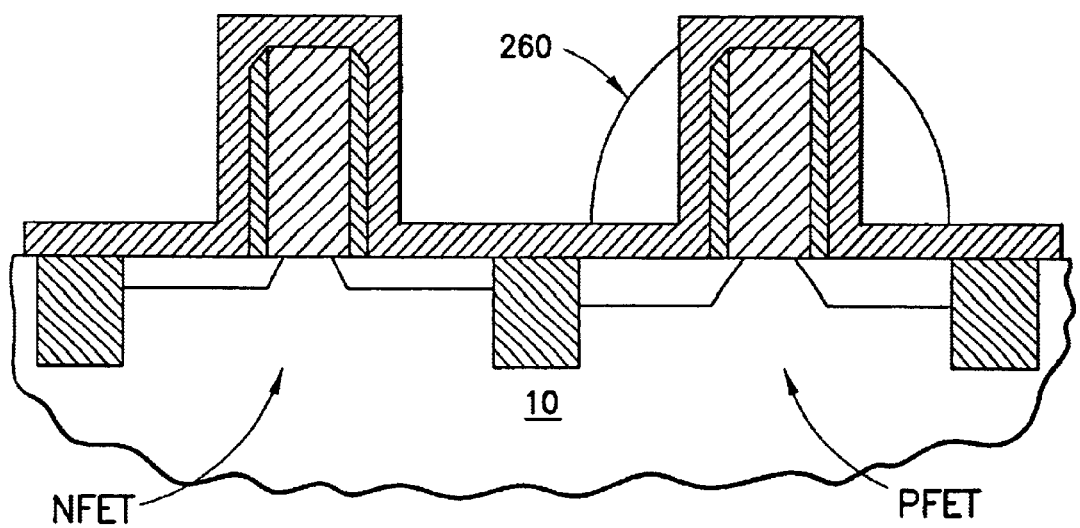
FIG. 9 shows the structure of FIG. 8, after a directional etch forming a spacer 260 comprising the dielectric 230 only on the PFET side.

FIG. 4 to FIG. 14 show two alternative process flows according to the present invention. Both flows start with FIG. 4 where isolations 190, gate stacks 200, extension implants 215 and extension spacers 210 are formed in conventional manner. Then, a thin film dielectric 220 (e.g., CVD nitride) is deposited (see FIG. 5). Then, a second film dielectric 230 (e.g. CVD oxide) is also deposited (see FIG. 6). In the first process flow, lithography is applied (FIG. 7). A photoresist 240 covers the PFET side and then part of the dielectric 230 exposed is removed by wet etch or dry etch (FIG. 8). This step leaves another part 250 of the thin film dielectric 230 remaining only on the PFET side. Then, a directional etch is used to form a spacer (S) 260 only on the PFET side (FIG. 9).

Figure 10:
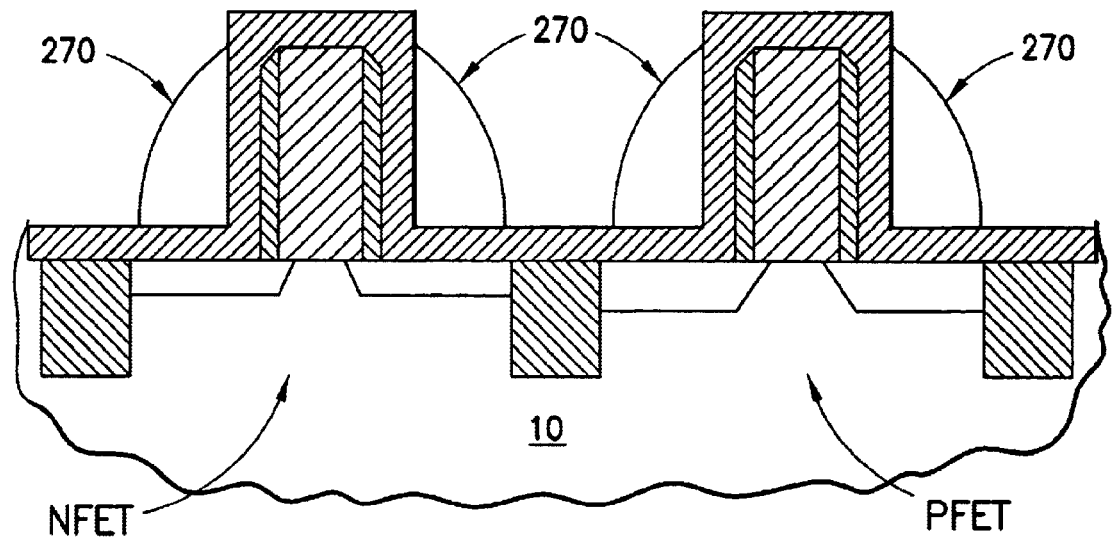
FIG. 10 shows the structure of FIG. 6, after a directional etch forming spacer 270 comprising dielectric 230 on both NFET and PFET.
Figure 11:
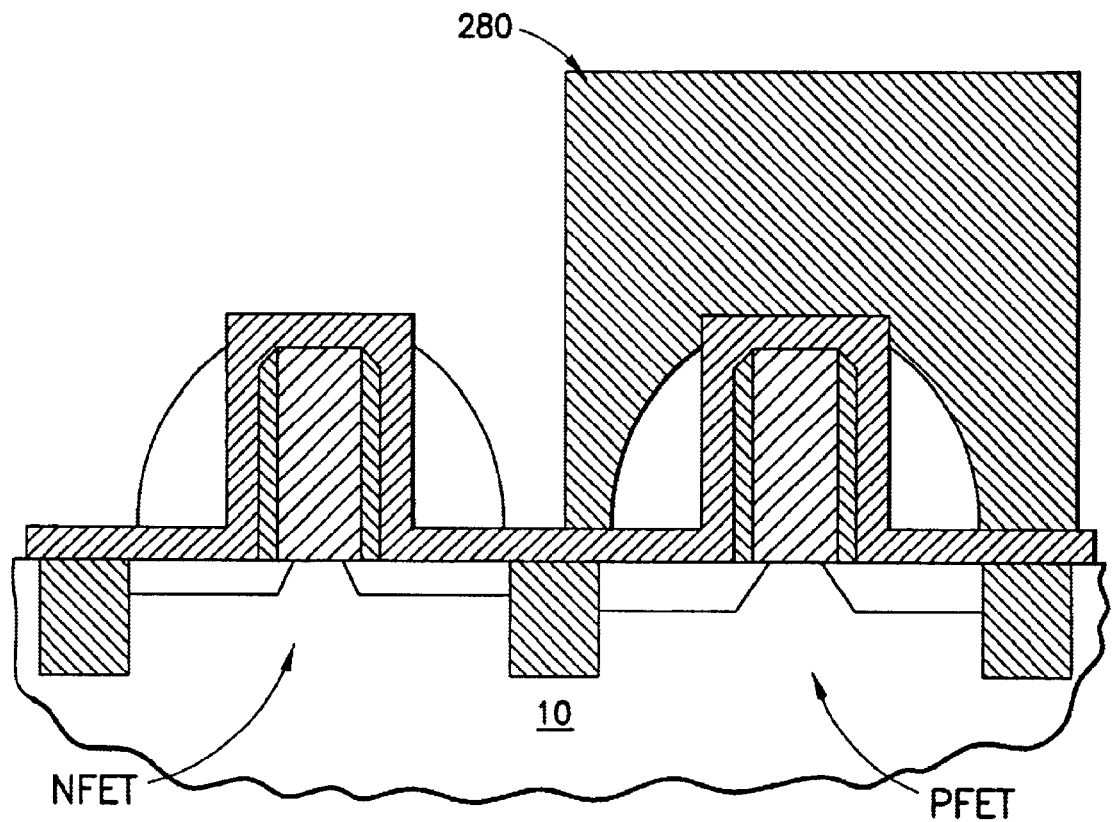
FIG. 11 shows the structure of FIG. 10, after a photoresist 280 is patterned.
Figure 12:
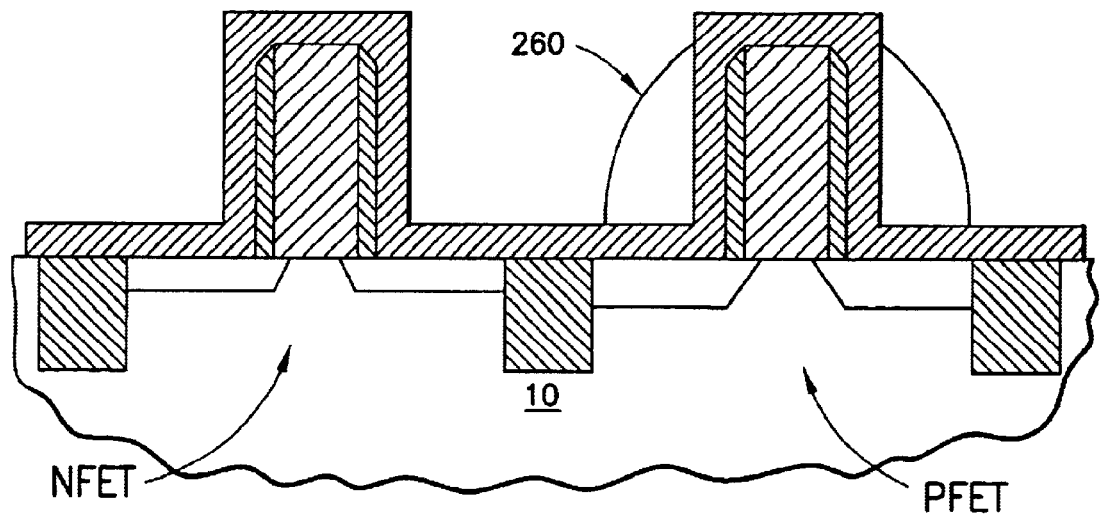
FIG. 12 shows the structure of FIG. 11, after an exposed part of dielectric 230 is removed, and the photoresist 280 is removed.
Figure 13:
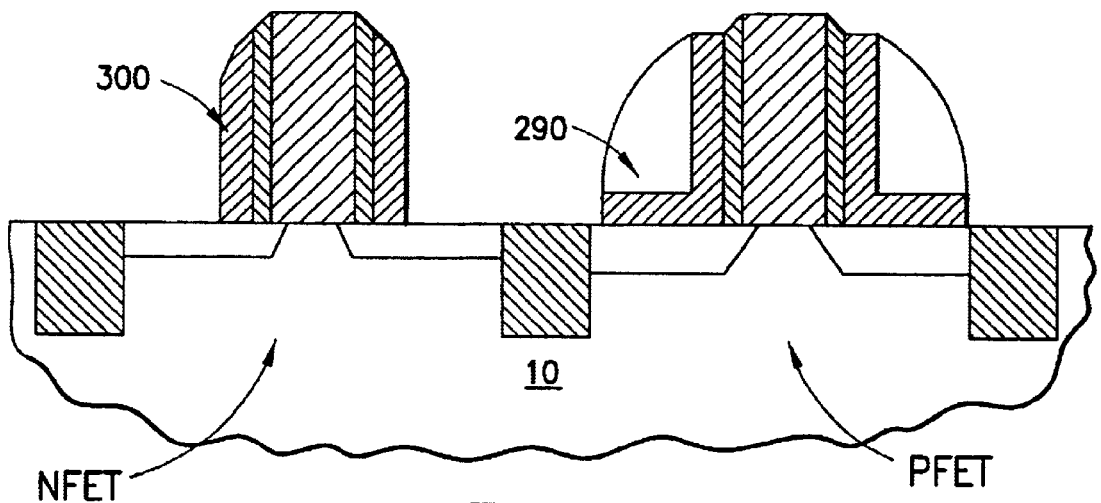
FIG. 13 shows the structure of FIG. 12 or FIG. 9, after a directional etch forming a narrow spacer 300 on the NFET side and L-shape composite spacer 290 on the PFET side.
Figure 14:
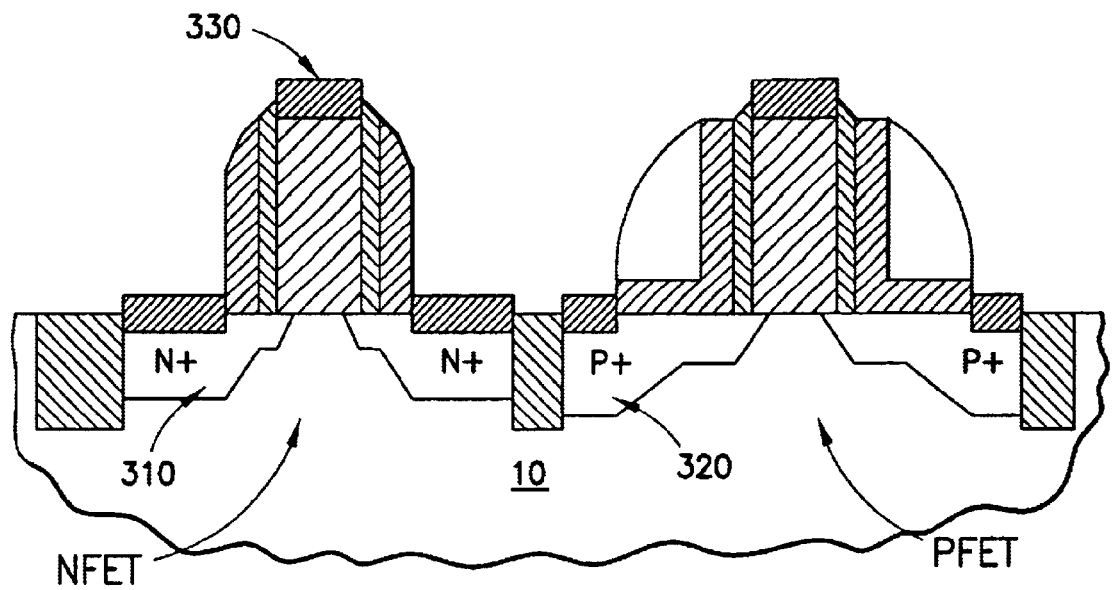
FIG. 14 shows the structure of FIG. 13, after source/drain implants 310, 320 and silicide formation 330.

The same intermediate structure (FIG. 9) can be achieved by an alternative process flow. Start from FIG. 6, wherein the second thin film dielectric 230 is deposited. Then, a directional etch is applied to form spacers 270 on both NFET and PFET with dielectric 230 (FIG. 10). Then, lithography is applied (FIG. 11). A photoresist 280 covers the PFET side and the spacers on the NFET side are removed (FIG. 12). The photoresist is removed, which results in spacers only on the PFET side 260. The structure at this stage is identical to the one from previous flow (FIG. 9).

Another directional etch of the first dielectric 220 from either structure in FIG. 9 or FIG. 12 results in narrow spacers 300 on the NFET side and composite L-shape spacers 290 on the PFET side. The final structure (FIG. 14) is formed after n-type 310 and p-type 320 source/drain formations, and silicide formations 330, with conventional techniques.

Figure 15:
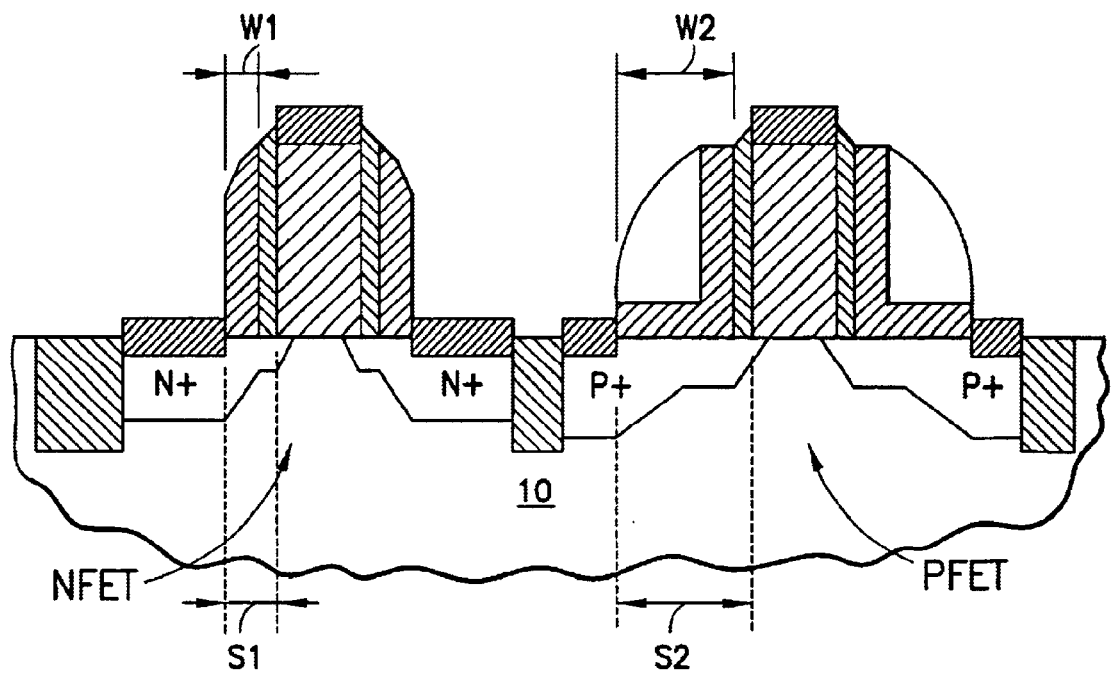
FIG. 15 is a cross-sectional schematic view of the inventive structure shown in FIG. 14, but further clarifying preferred features S1 and S2 of the invention.

To recapitulate the alternative preferred process steps according to the present invention:

1) Provide starting wafer substrate (e.g., bulk, SOI, GaAs)
2) Perform conventional CMOS device processing:
   Device Isolation
   Gate Stack Formation
   Extension Implants
3) Deposit thin film dielectric 220 (e.g. CVD nitride). Film thickness should be minimized to result in a highest possible NFET drive current. The nitride thickness determines the final silicide to polysilicon gate spacing S1 (FIG. 15). The poly to silicide spacing is critical to achieving high NFET drive current—saturated drive current output at drain. Deposited thickness in the range 10 nm–40 nm is preferable.
4) Deposit second dielectric film 230 (e.g. CVD oxide). This film thickness is chosen to independently optimize PFET short channel control—control of leakage current rolloff in the technology L Poly range. The film 230 thickness determines the final silicide to poly gate spacing S2 (FIG. 15). The film thickness in a range of 40 nm–100 nm can be chosen.

A spacer using the second dielectric film 230 covering only the PFET devices can now be formed using two independent methods.

Process Option #1
5a) Pattern photoresist 240 to cover PFET devices and expose NFET devices. The second dielectric film 230 is now removed from NFET devices via a wet or dry etch. Remove the photoresist 240 by conventional methods. The second dielectric film now covers only the PFET devices.
5b) A directional etch is used to form a spacer from the second dielectric film. This spacer 260 is formed only on the PFET devices.

Process Option #2
5aa) A directional etch is used to form spacers from the second dielectric film. This spacer is formed on both NFET and PFET devices.
5bb) Pattern photoresist to cover PFET devices and expose NFET devices. The spacer is removed from the NFET devices via wet or dry etch. The spacer formed using the second dielectric film covers only the PFET devices.

6) A second directional etch is used to form a narrow, I-shaped spacer on the NFET device and a wider, L-shaped spacer on the PFET device.
7) The final structure is formed after n-type and p-type source/drain formation and silicide formation.

Preferably:
W2 is in a range of 50 nm to 120 nm;
S1—substantially uniform in a range 1 nm to 20 nm;
S2—substantially uniform in a range 30 nm to 90nm.

What is claimed is:

1. A semiconductor device structure, comprising:
   at least first and second field effect transistors formed on one substrate,
   said first field effect transistor including a first spacer having a first width;
   said second field effect transistor including a second spacer having a second width;
   said first width being different than said second width, wherein said first width has a maximum width in a range of 10 nm to 40 nm, and said second width has a maximum width in a range of 50 nm to 120 nm, so as to increase a drive current performance of said first field effect transistor and to decrease a short channel effect in said second field transistor during a normal operation of said device structure, and
   wherein said structure includes a width transition region located approximately in a middle region between said transistors.

2. A semiconductor device structure, comprising:
   at least first and second field effect transistors formed on one substrate,
   said first field effect transistor including a first spacer having a first width;
   said second field effect transistor including a second spacer having a second width;
   said first width being different than said second width, wherein said first width has a maximum width in a range of 10 nm to 40 nm, and said second width has a maximum width in a range of 50 nm to 120 nm, so as to increase a drive current performance of said first field effect transistor and to decrease a shown channel effect in said second field transistor during a normal operation of said device structure, and
   wherein said first spacer is I-shaped and said second spacer has an L-shaped part.

3. A semiconductor device structure, comprising:

at least first and second field effect transistors formed on one substrate, said first field effect transistor including a first spacer having a first width;

said second field effect transistor including a second spacer having a second width;

said first width being different than said second width, wherein said first width has a maximum width in a range of 10 nm to 40 nm, and said second width has a maximum width in a range of 50 nm to 120 nm, so as to increase a drive current performance of said first field effect transistor and to decrease a short channel effect in said second field transistor during a normal operation of said device structure, and wherein said first spacer is I-shaped.

4. A semiconductor device structure, comprising:

at least first and second field effect transistors formed on one substrate, said first field effect transistor including a first spacer having a first width;

said second field effect transistor including a second spacer having a second width;

said first width being different than said second width, wherein said first width has a maximum width in a range of 10 nm to 40 nm, and said second width has a maximum width in a range of 50 nm to 120 nm, so as to increase a drive current performance of said first field effect transistor and to decrease a short channel effect in said second field transistor during a normal operation of said device structure, and wherein said second spacer has an L-shaped part.

5. A semiconductor device structure, comprising:

at least first and second field effect transistors formed on one substrate, said first field effect transistor including a first spacer having a first width;

said second field effect transistor including a second spacer having a second width;

said first width being different than said second width, said first width being different than said second width, wherein said first width has a maximum width in a range of 10 nm to 40 nm, and said second width has a maximum width in a range of 50 nm to 120 nm, so as to increase a drive current performance of said first field effect transistor and to decrease a short channel effect in said second field transistor during normal operation of said device structure, and wherein said first field effect transistor has a final suicide to gate spacing ($S1$) in a range of 10 nm to 20 nm, and said second field effect transistor has a final silicide to gate spacing ($S2$) in a range of 50 nm to 90 nm.

6. The structure as claimed in claim 1, wherein said first field effect transistor is an NFET and said second field effect transistor is a PFET.

7. The structure as claimed in claim 1, where said first width is less than said second width.

8. The structure as claimed in claim 1, wherein said structure is an inverter.

* * * * *